United States Patent [19]

Kalisvaart

[11] 3,912,949

[45] Oct. 14, 1975

[54] DRIVING CIRCUIT FOR PIN DIODE SWITCHES

[75] Inventor: Adri C. Kalisvaart, Providence, R.I.

[73] Assignee: North American Philips Corporation, New York, N.Y.

[22] Filed: May 28, 1974

[21] Appl. No.: 473,890

[52] U.S. Cl. .................. 307/280; 307/268; 307/300

[51] Int. Cl.² .......................................... H03K 3/33

[58] Field of Search..................... 307/268, 280, 300

*Primary Examiner*—John Kominski

*Attorney, Agent, or Firm*—Frank R. Trifari; George B. Berka

[57] ABSTRACT

The driving amplifier comprises a fast a.c. part including a pair of transistors capacitively coupled to a source of input signal and each having a discharging resistor bridging the base-emitter junction. To speed-up the discharge, semiconductive diodes are connected in reverse direction to the base-emitter junctions of the transistors. The outputs of the transistors are coupled to a relatively slow d.c. part providing bias currents for the PIN diodes.

3 Claims, 4 Drawing Figures

DRIVING CIRCUIT FOR PIN DIODE SWITCHES

This invention relates generally to a pulse amplifier for driving PIN diode microwave switches and, more particularly, to a fast a.c. part of the amplifier.

The driving amplifier of this type supplies sink and source direct current bias in order to keep a microwave switch in the ON or OFF position and, it also supplies current spikes on the leading and trailing edges of the output pulses. These current spikes sweep the stored charge from the PIN diodes which action results in fast switching of the microwave switches.

A deficiency of known driving amplifiers is the frequency dependence of the amplitude of the current spikes.

An object of this invention is to avoid this drawback and to provide a driver the output current spikes (or surges) of which remain constant up to high frequencies.

Another object of this invention is to provide an amplifier which can be used in integrated driver-diode modules with TTL input signals and microwave output signals.

According to this invention, the above objects are attained by providing a relatively slow d.c. drive circuit which supplies the bias current for the microwave PIN diodes, with a fast a.c. drive circuit which includes a complementary pair of transistors connected by coupling capacitors to a source of input pulse signal. One of the transistors is turned on via a coupling capacitor in response to the leading or positive going edge of the input pulse and delivers the negative going spike current. The other transistor is turned on via its coupling capacitor on the trailing or negative-going edge of the input signal and delivers the positive going spike. The collector current spikes of the transistors can either be fed directly to the PIN diode load or go via the baseemitter junctions of respective transistors in the output push-pull stage which can further amplify the output current spikes.

For a fuller understanding of the nature and objects of the invention, reference is had to the following detailed description, taken in connection with the accompanying drawings, in which.

Figure 1:
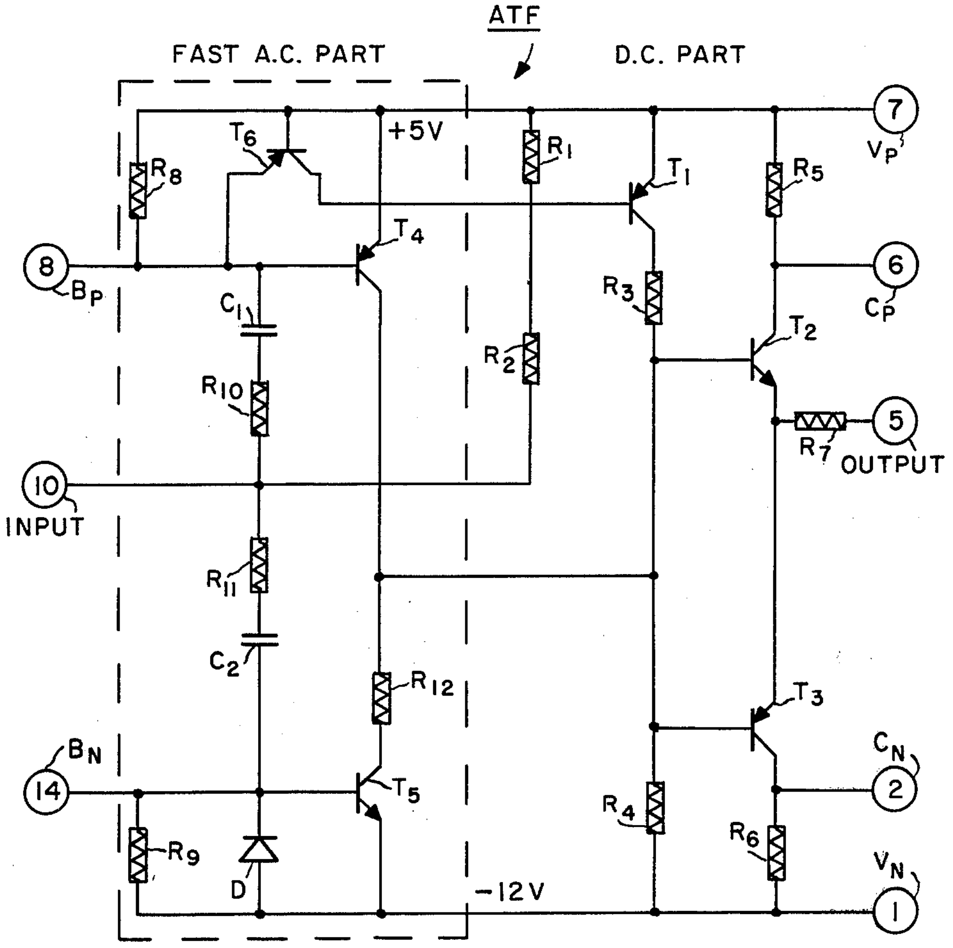
FIG. 1 is a schematic diagram of one embodiment of the driving circuit according to this invention.
Figure 2:
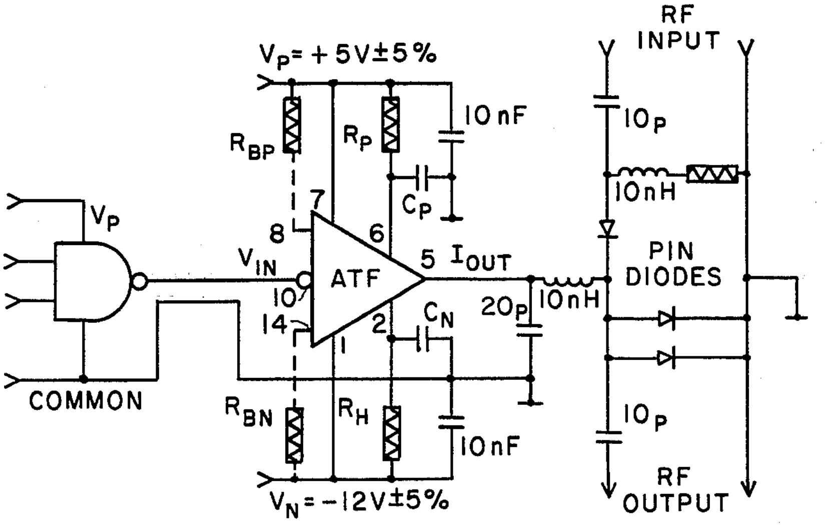
FIG. 2 shows a block-diagram of a driving circuit of this invention incorporated in a conventional microwave PIN diode switching circuit.
Figure 2A:
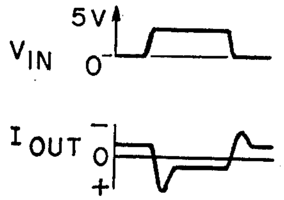
Figure 3:
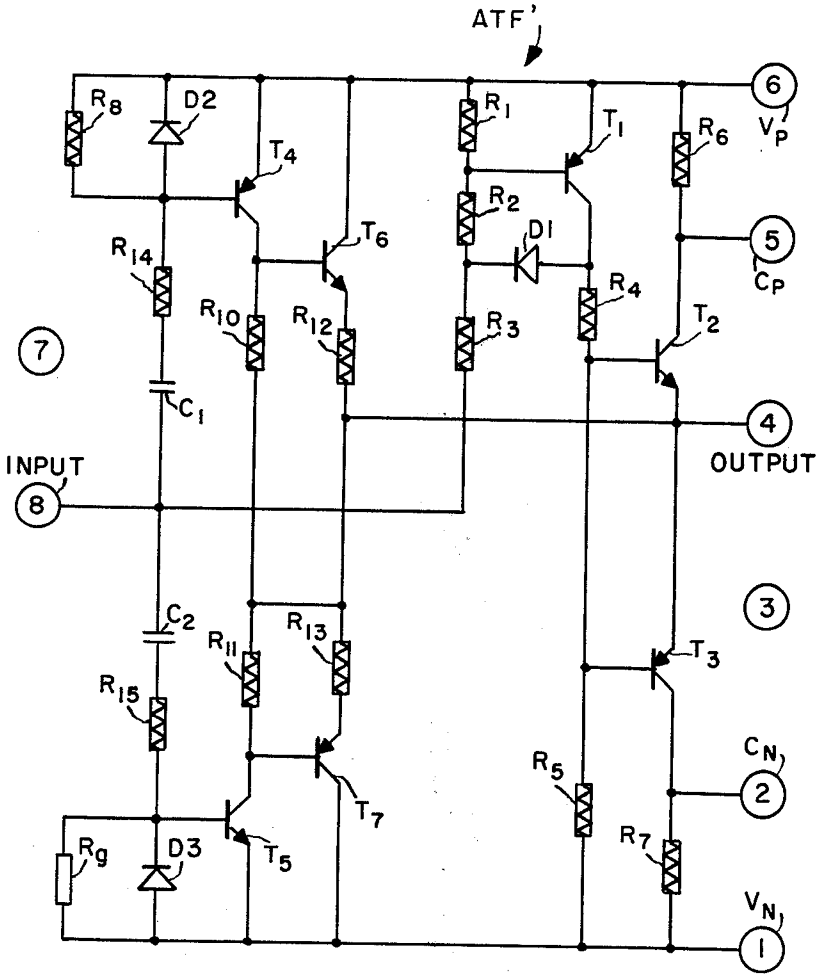

FIG. 2*a* is a time diagram of input and output signals in the driving circuit as shown in FIGS. 1 and 2; and FIG. 3 is a modification of the driving circuit of FIG. 1.

Referring now to FIG. 1, the illustrated driving circuit ATF is an inverting pulse amplifier designed to drive the PIN diodes in fast microwave switches. The operation of the circuit can best be understood by dividing the circuit in two parts, namely a relatively slow DC part and a fast AC part. The DC part supplies the bias current for the microwave PIN diodes, and includes an inverter including a transistor T1 and a push-pull output stage including transistors T2 and T3. The transistor T1 is "Off" when the input voltage is "High" or when the input is left open. An output sink current will now flow via transistor T3 to the negative supply $V_N$. The value of the current is determined by the base resistor R4 and the collector resistor R6 of the transistor T3, and can be raised with an external resistor in parallel with R6. If the output load is a reverse biased diode, the output voltage will almost be equal to $V_N$ at the terminal 1. With a logic signal High at the input, the positive supply current $I_P$ at the terminal 7 is zero and the negative supply current $I_N$ at the terminal 1 is equal to the output sink current at the terminal 5.

Transistor T1 is "On" when the input voltage is "Low" or is shorted to the ground. An output source current will now flow from the positive supply $V_p$ at the terminal 7 via transistor $T_2$. The value of the source current is determined by the base resistor R3 and the collector resistor R5 of the transistor T2, and can also be raised by an external resistor in parallel with R5. With a logic signal Low at the input, the negative supply current is equal to the current loss through R4. The positive supply current is equal to the output source current plus the current flowing through resistors R1 and R2 at the input.

The novel AC part of the driving circuit ATF of this invention includes a pair of complementary transistors T4 and T5 and the coupling capacitors C1 and C2. The transistor T5 delivers the negative going current-spike and T4, the positive going spike.

Transistor T5 is only turned-on on the leading or positive going edge of the input signal via the capacitor C2. The collector current of T5 is limited by the collector resistor R12 plus the damping resistor R7 and by the drop in gain at high current levels.

Transistor $T_4$ is only turned-on on the trailing or negative going edge of the input voltage via the capacitor $C_1$. The collector current of $T_4$ is limited by the resistor $R_7$ and the drop in gain at high current levels.

Base currents for the transistors T4 and T5 flows only for the duration of the fall and the rise time of the input voltage. However, the collector current spikes last longer because of charge storage effects. The base charge for the transistors is about $C \times (VIN\text{-}VBE) \approx 100pC$. This charge is mainly used up by the collector current, but also by the reverse base current through R8 and R9, and to a lesser extent by recombination in the base region. Making the base-emitter resistors R8 and R9 smaller offers an effective means of reducing the pulse width of the output current spikes. The 50 percent pulse width of the current spike is typical about 30NS.

The circuit has good noise immunity properties. The input voltage must change by as much as a base-emitter voltage before either of the transistors T4 and T5 will be turned on.

The collector current spikes of T4 and T5 do not go directly to the output PIN diode but go via the base-emitter junction of T2 and T3. In doing so, the gain of the push-pull output stage can be used to amplify the output current spikes. The collector current of the transistors T2 and T3 is limited by their collector resistors R5 and R6. However, the initial amplitude of the collector current can be raised by adding external capacitors in parallel with R5 and R6.

The series damping resistor R7 is added to limit the possibility of ringing due to the external capacitors.

The coupling capacitors C1 and C2 are charged by the base current of transistors T4 and T5. They are discharged through the resistors R8 and R9. The discharging is speeded up by the emitterbase junction of I6 and the diode D in parallel with the resistors. The fast discharge makes repetition rates of up to 20 MHz possible without loss in current spike amplitude. The discharge current for Cl is used to quickly turn-off the transistor T1 via T6. The turn-off of T1 should not be more than about 30 NS. Otherwise, the DC part will not switch within the duration of the current spikes.

The driver ATF is preferably made in the form of a thin film hybrid circuit in a hermetically sealed flat pack, and is used in integrated driver-diode modules with TTL input signals and microwave output signals; a +5 Volt and −12 Volt supply is needed.

The switch driver provides bias current for the PIN-diodes of at least 8MA from either the positive or the negative supply, depending on whether the input from the TTL is a Low or a High voltage. These bias currents can be adjusted up to 30MA with external resistors.

The switch driver provides output current - surges or spikes on the leading and the trailing edge of the input voltage. These spikes inject or remove carriers from the PIN-diode junctions. The amplitude of these current spikes is typical 100MA with total switching times of less than 10 NS. The amplitude and width of these current spikes can be modified with external capacitors and resistors respectively. Repetition rates from DC to 20 MHz are possible with the ATF circuit of this invention.

Typical application of the ATF circuit is in a microwave single pole single throw switch as shown in FIG. 2. Normally no external components are required except for the decoupling capacitors of about 10 NF. If higher bias currents are needed the resistors Rp and RN can be added. $C_N$ or $C_P$ raise the amplitude of the current spikes on the leading or trailing edge. With $R_{BP}$ and $R_{BN}$ and no $C_P$ and $C_N$ the current spike amplitude and pulse width can be reduced.

The time relation of the wave-forms of the input voltage $V_{IN}$ and the output current spikes $I_{OUT}$ of the circuit ATF is illustrated in FIG. 2*a*.

The modified circuit as shown in FIG. 3 is similar to the ATF circuit of FIG. 1 except for the additional pair of transistors T6 and T7 which are added if current spikes with a greater amplitude are required. As it has been mentioned previously, the amplitude of the leading and trailing edge current spikes in the circuit of this invention is not affected by the frequency of switching up to 20 MHz.

I wish it to be understood that I do not desire to be limited to the axact details of construction shown and described, for obvious modifications will occur to a person skilled in the art.

Having thus described the invention, what I claim as new and desire to be secured by Letters Patent, is as follows:

What is claimed:

1. A driving circuit for PIN diodes switches comprising a fast a.c. drive part including a pair of transistors capacitively coupled to a source of input pulse signals for producing a current spike of one polarity in response to the leading edge of the input pulse and a current spike of opposite polarity in response to the trailing edge of the input pulse, discharging means coupled to each transistor for removing the charge stored in said transistors after the fall-time or the rise-time of the input pulse, and a d.c. d.c. drive part controlled by the output of said transistors to supply the bias direct currents for the PIN diodes.

2. A driving circuit according to claim 1 wherein said discharging means includes parallel connection of resistors with diode means bridging respective base-emitter junctions of said transistors.

3. A driving circuit according to claim 2 further including an additional transistor having a base-emitter junction connected in reverse direction to the base-emitter junction of one of said transistors, and an inverter in said d.c. part having an input controlled by said additional transistor.

* * * * *